: US 6,573,482 B2
Mokuo
(45) Date of Patent: Jun. 3, 2003

(54) HEATING DEVICE, LIQUID PROCESSING APPARATUS USING THE HEATING DEVICE AND METHOD OF DETECTING FAILURE THEREOF

(75) Inventor: Shori Mokuo, Tosu (JP)

(73) Assignee: Tokyo Electron Limited, Tokyo-To (JP)

( * ) Notice: Subject to any disclaimer, the term of this patent is extended or adjusted under 35 U.S.C. 154(b) by 206 days.

(21) Appl. No.: 09/923,816

(22) Filed: May 1, 2001

(65) Prior Publication Data

US 2002/0063121 A1 May 30, 2002

(30) Foreign Application Priority Data

May 1, 2000 (JP) ........................................ 2000-132206

(51) Int. Cl.[7] .................................................. H05B 1/02
(52) U.S. Cl. ...................... 219/481; 219/519; 219/494; 236/46 R
(58) Field of Search ................................. 219/506, 519, 219/481, 490, 491, 501, 497, 494; 307/117; 236/46 R; 337/301–303, 363

(56) References Cited

U.S. PATENT DOCUMENTS 4,277,671 A * 7/1981 Mori et al. .................. 219/494
4,493,983 A * 1/1985 Taggert ....................... 219/494
5,308,957 A * 5/1994 Huffington .................. 219/483
6,137,091 A * 10/2000 Kikuoka et al. ............ 219/501

* cited by examiner

Primary Examiner—Mark Paschall
(74) Attorney, Agent, or Firm—Smith, Gambrell & Russell, LLP

(57) ABSTRACT

A liquid processing apparatus includes a liquid processing unit 30 for supplying objects to be processes, such as wafers W, with a processing liquid for liquid processing, a processing-liquid supplying unit 100 for supplying heated processing liquids 12a, 12b to the liquid processing unit 30 and a heating unit 200 for heating the liquids 12a, 12b up to a predetermined temperature. The heating unit 200 has a heater 16 for heating the liquids 12a, 12b, a power supply circuit for supplying the heater 16 with electricity, a temperature sensor 14 and a temperature regulator 13 both forming an output control unit for controlling an output from a power source 20 to the heater 16, a solid state relay 19 for switching on/off the operation of the power supply circuit by signals from the temperature regulator 13, and failure detecting units. The failure detecting units include a contact monitor 1 for monitoring an ON/OFF contact 32 in a power switch 21, a primary-side signal detecting monitor 2 for detecting ON/OFF signals from the temperature regulator 13 to the solid state relay 19, and a secondary output voltage detecting monitor 4 for detecting secondary-side ON/OFF signals of the solid state relay 19, providing a heating device capable of determining the cause of failure finely and also the liquid processing apparatus using the heating device, which is used for applying a designated liquid processing to various kinds of substrates, for example, semiconductor wafers, LCD substrates, etc.

18 Claims, 3 Drawing Sheets

HEATING DEVICE, LIQUID PROCESSING APPARATUS USING THE HEATING DEVICE AND METHOD OF DETECTING FAILURE THEREOF

BACKGROUND OF THE INVENTION

1. Technical Field of the Invention

The present invention relates to a heating device capable of judging the cause of failure, a liquid processing apparatus using the heating device and a method of detecting the failure. For example, the invention relates to a liquid processing apparatus for applying a designated liquid processing on various kinds of substrates, such as semiconductor wafers and LCD substrates.

2. Description of the Related Art

In the method of controlling the operation of a heater driven by electric power, there is known a method having the following steps of: connecting a sensor for detecting the temperature of an object to be processed to a temperature regulator; comparing a target temperature set in the temperature regulator with an actual temperature of the object to be processed; and transmitting ON/OFF signals to control the power supply for the heater for heating the object, from the temperature regulator to a solid state relay between a power source and the heater; whereby the heating operation of the heater can be switched on and off by the ON/OFF control for the solid state relay.

As the method of detecting a failure in the heater control circuit having the above solid state relay, there has been generally adopted a method of detecting whether the heater is breaking upon detection of a current flowing through the heater by a current transformer (CT).

In the above failure detecting method using the current transformer (CT), however, there is the possibility that other failures besides the breaking down of the heater, for example, breaking down of the solid state relay, failure of the contact such as magnet conductor in a power switch for the heater, etc. are regarded as the breaking down of the heater.

In the solid state relay, there is also known one equipped with a diagnostic function to detect the failure. However, this solid state relay is provided with little kinds and also expensive. Moreover, this solid state merely is capable of detecting its own malfunction and no more than. In this way, due to the impossibility of classifying the cause of failure in the heater control circuit finely, every time the heater control circuit is out of order, it is required to take measures, for example, inspecting of questionable parts, replacing of all parts, etc. Such measures are far from being desirable in the aspects of maintenance and cost.

SUMMARY OF THE INVENTION

Under the above-mentioned situation, the object of the present invention is to provide a heating device in which a heater control circuit has a plurality of built-in monitors allowing the failure in the circuit to be classified into every cause thereby to facilitate the measures against the failure in the superior maintenance. Further, the object of the invention is to provide a liquid processing apparatus using the heating device and also a failure detecting method for the heating device.

The first feature of the present invention resides in the provision of a heating device comprising:
  a heater for heating an object to be heated;
  a power supply circuit for supplying electric power from a power source to the heater;
  a power switch for switching on and off a power output from the power source;
  an output control circuit for controlling the power output from the power source to the heater;
  a relay for switching on and off the operation of the power supply circuit in accordance with signals outputted from the output control circuit; and
  a failure detecting circuit for detecting an operational failure of the heating device;
  wherein the failure detecting circuit includes
    a first monitor for monitoring the operation of an ON/OFF contact in the power switch;
    a second monitor for detecting ON/OFF signals transmitted from the power control circuit to the relay; and
    a third monitor for detecting an output voltage on a secondary side of the relay.

According to the second feature of the invention, the relay, the second monitor and the third monitor are formed by a solid state relay.

According to the third feature of the invention, the heating device further comprises a control board which displays an output of the first monitor, an output of the second monitor and an output of the third monitor respectively.

According to the fourth feature of the invention, the failure detecting circuit further includes a fourth monitor which includes a current transformer for detecting a current flowing through the heater and further generates the detected current in form of ON/OFF signals standardizing a constant threshold current value.

According to the fifth feature of the invention, the output control circuit includes:
  a temperature sensor for detecting a temperature of the object to be heated; and
  a temperature regulator in which a designated temperature is preset for the object and which generates ON/OFF signals to the relay upon comparing the detected temperature of the object with the designated temperature.

According to the sixth feature of the invention, there is further provided a liquid processing apparatus comprising:
  a liquid processing unit which supplies an object to be processed with a processing liquid thereby to carry out a liquid processing;
  a processing-liquid supplying unit to supply the heated processing liquid to the liquid processing unit; and
  a heating unit for heating the processing liquid to a predetermined temperature;
  wherein the heating unit includes:
    a heater for heating the processing liquid;
    a power supply circuit for supplying the heater with an electric power from a power source;
    a power switch for switching on and off a power output from the power source;
    an output control circuit for controlling the power output supplied from the power source to the heater;
    a relay for switching on and off the operation of the power supply circuit in accordance with signals generated from the output control circuit; and
    a failure detecting circuit for detecting an operational failure of the heating unit; and
  the failure detecting circuit includes:
    a first monitor for monitoring the operation of an ON/OFF contact in the power switch;
    a second monitor for detecting ON/OFF signals transmitted from the power control circuit to the relay; and
    a third monitor for detecting an output voltage on a secondary side of the relay.

According to the seventh feature of the invention, the failure detecting circuit of the above liquid processing apparatus further includes a fourth monitor which includes a current transformer for detecting a current flowing through the heater and further generates the detected current in form of ON/OFF signals standardizing a constant threshold current value.

According to the eighth feature of the invention, the output control circuit of the above liquid processing apparatus includes:

a temperature sensor for detecting a temperature of the processing liquid; and a temperature regulator in which a designated temperature is preset for the processing liquid and which generates ON/OFF signals to the relay upon comparing the detected temperature of the processing liquid with the designated temperature.

According to the ninth feature of the invention, the failure detecting circuit of the above liquid processing apparatus includes an overheat monitor which monitors both a temperature of the processing liquid and a temperature of the heater thereby to detect whether the processing liquid is overheated or not.

According to the tenth feature of the invention, the liquid processing apparatus further comprises an ON/OFF switch interposed in a wiring between the output control circuit and a primary side of the relay.

According to the eleventh feature of the invention, the liquid processing apparatus further comprises an interlocking circuit which turns the power switch off when the quantity of the processing liquid to be heated is less than a predetermined quantity.

According to the twelfth feature of the invention, the processing-liquid supplying unit of the liquid processing apparatus includes:

a tank having the processing liquid stored therein, the tank being equipped with the heater;

a supply pipe through which the processing liquid is supplied from the tank to the liquid processing unit; and a collecting pipe for collecting the processing liquid which has been used in the liquid processing unit, into the tank.

According to the thirteenth feature of the invention, the tank has an inner tank and an outer tank in double structure and the collecting pipe is connected to the outer tank. Further, the heater is arranged in the periphery of the outer tank.

According to the fourteenth feature of the invention, the output control circuit includes:

a temperature sensor arranged in the outer tank to detect the temperature of the processing liquid; and a temperature regulator in which a designated temperature is preset for the processing liquid and which generates ON/OFF signals to the relay upon comparing the detected temperature of the processing liquid with the designated temperature, and the output control circuit controls so that the temperature of the processing liquid in the outer tank is maintained to the designated temperature.

According to the fifteenth feature of the invention, the processing-liquid supply unit of the liquid processing apparatus has a tank having the processing liquid stored therein, the tank being equipped with the heater. Further, the liquid processing apparatus further comprises a level sensor disposed in the tank to detect a level of the processing liquid stored in the tank and an interlocking circuit which turns the power switch off when the quantity of the processing, liquid to be heated is less than a predetermined quantity.

According to the sixteenth feature of the invention, there is further provided a failure detecting method of detecting a circuit failure in a heating device, the heating device having a power supply circuit connecting a power source to a heater, an ON/OFF contact arranged in the power supply circuit and also operated by a power switch to supply the heater with electric power and a relay arranged in the power supply circuit to control the power supply for the heater intermittently, the method comprising the step of:

in case of turning the power switch off, detecting at least one of the operation of the ON/OFF contact, the ON/OFF state of an output voltage on a secondary side of the relay and the ON/OFF state of a current in the power supply circuit; and judging whether the ON/OFF contact has a failure, on a basis of a result of the detecting step.

According to the seventeenth feature of the invention, there is provided another failure detecting method of detecting a circuit failure in a heating device, the heating device having a relay arranged in a power supply circuit connecting a power source to a heater, for controlling the power supply for the heater intermittently, the method comprising the step of:

detecting the ON/OFF state of an input signal on a primary side of the relay and the ON/OFF state of an output voltage on a secondary side of the relay; and judging whether the relay is subjected to snapping or short-circuit, on a basis of a result of the detecting step.

According to the eighteenth feature of the invention, the above failure detecting method further comprises the step of detecting the ON/OFF state of a current flowing through the power supplying circuit, whereby the snapping of the heater can be detected on a basis of a result of the detecting step.

With the constitution mentioned above, in the heating device of the present invention and the liquid processing apparatus using the heating device, since they are commonly provided with various monitors as "built-in" failure detecting means, the failures in the heater, the power supply circuit and the output control means can be judged for every cause, for example, snapping of the heater, snapping or short-circuit in the solid state relay, abnormality in the power source for the heater, etc. Accordingly, even if the heating device and the liquid processing apparatus are out of order, the recovery/measures against the malfunction is facilitated thereby to improve both heating controllability and maintenance of the device and apparatus. Additionally, since these monitors serving as the failure detecting means do not require any expensive parts, there is no possibility to cause the increasing of device/apparatus cost,

DESCRIPTION OF THE PREFERRED EMBODIMENT

With reference to attached drawings, an embodiment of the present invention will be described below while taking example by a liquid processing apparatus using a heating device of the invention. Although the liquid processing apparatus of the invention is applicable to a cleaning apparatus and also a liquid-applying apparatus for various kinds of substrates, the following embodiment relates to an application of the invention to a cleaning apparatus for rinsing semiconductor wafers which will be referred as "wafers" hereinafter.

Figure 1:
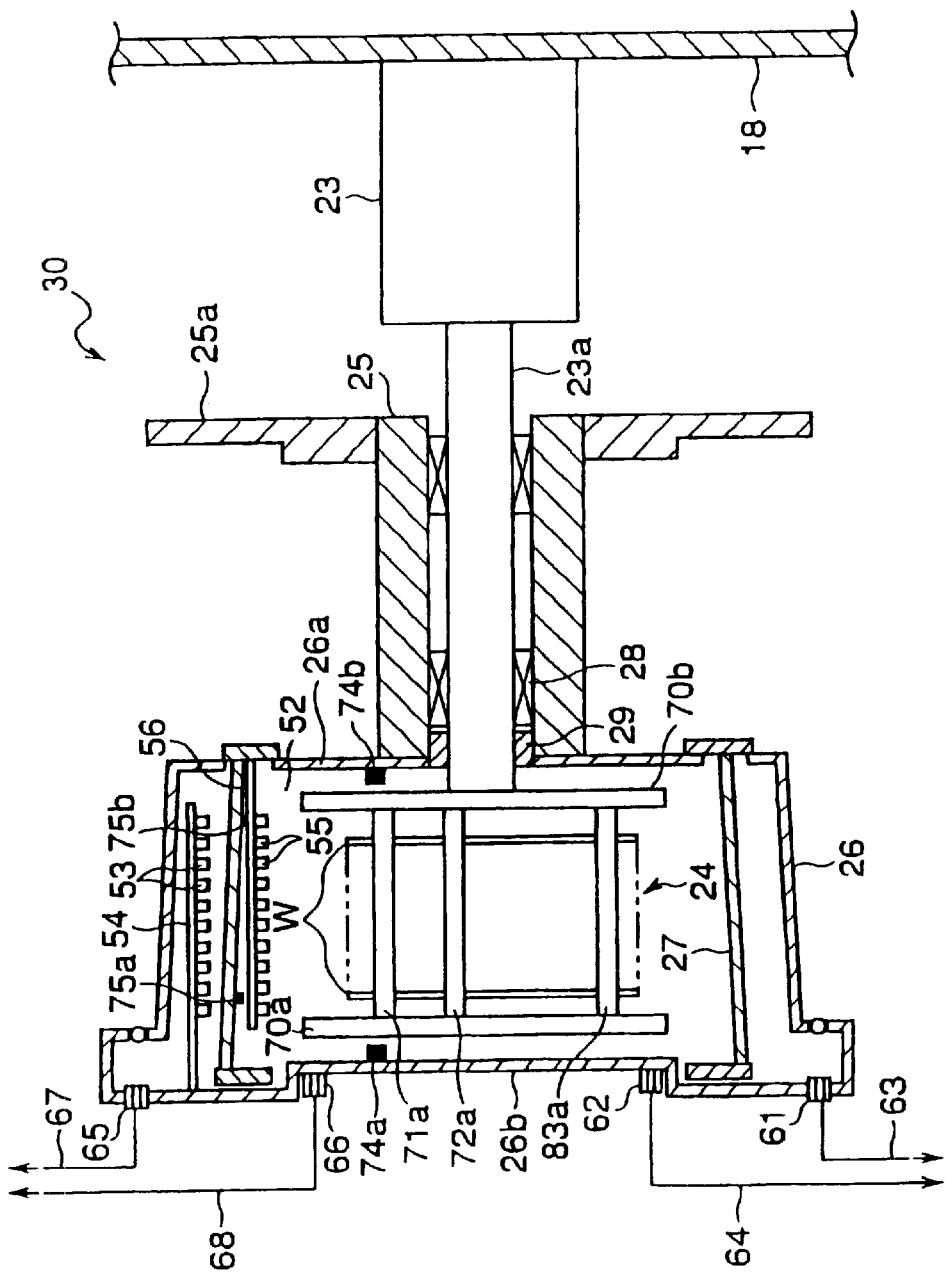
FIG. 1 is a sectional view showing an embodiment of a processing part of a liquid processing apparatus using a heating device of the present invention.
Figure 2:
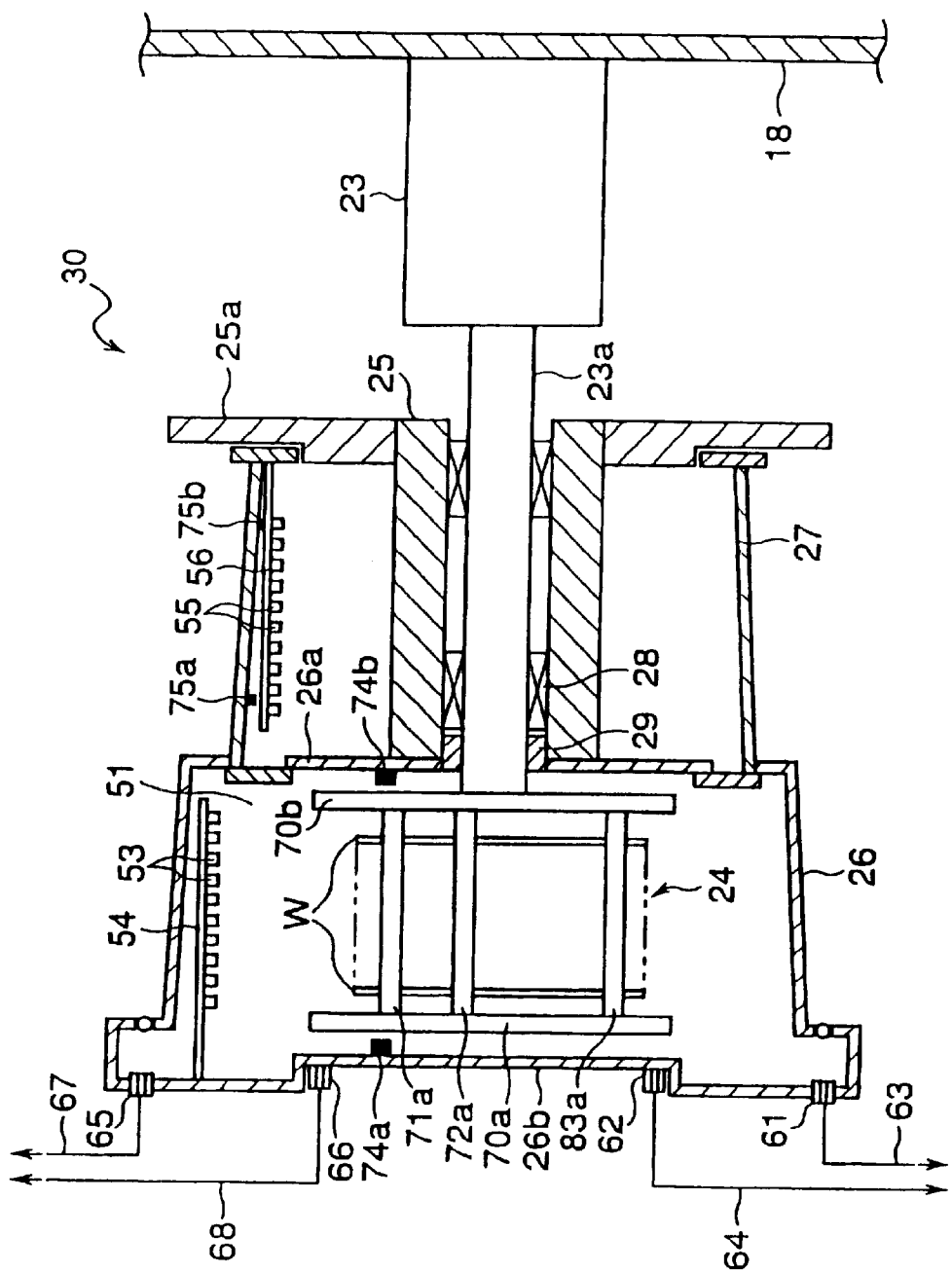
FIG. 2 is a sectional view showing another condition of the processing part of FIG. 1.

FIGS. 1 and 2 are sectional views each showing one embodiment of a liquid processing (cleaning) unit 30 in the cleaning apparatus; FIG. 1 shows a state where an inner chamber 27 is accommodated in an outer chamber 26 and FIG. 2 shows another state where the inner chamber 27 is withdrawn from the outer chamber 26.

The cleaning unit 30 serves to remove resist-mask, polymer layer as etching residual, etc. from the wafers W after performing the etching process. The cleaning unit 30 includes a support wall 18 standing vertically, a motor 23 fixed on the support wall 18 and equipped with a horizontal rotating shaft 23a, a rotor 24 secured on the rotating shaft 23a, a cylindrical-shaped support cylinder 25 surrounding the shaft 23a of the motor 23, the outer chamber 26 adapted to surround the rotor 24 and the inner chamber 27 adapted to perform the liquid processing when it is arranged inside the outer chamber 26.

The rotor 24 is capable of carrying a plurality (e.g. 26 pieces) of wafers W each arranged vertically and all arranged in the horizontal direction. The rotor 24, together with the wafers W which are engaged by engagement members 71a, 71b (not shown: behind the member 71a), 72a and 72b (not shown. behind the member 72a) and also supported by supporting members 83a and 83b (not shown: behind the member 83a), is rotated by the motor 23 through the rotating shaft 23a. Note, these engagement members 71a, 71b, 72a and 72b are bridged between a pair of circular plates 70a and 70b arranged at a predetermined distance.

The outer chamber 26 and the inner chamber 27 are together shaped to be generally cylindrical. In order to accomplish the inner chamber 27 being accommodated in the outer chamber 26 as shown in FIG. 1 and also being withdrawn from the outer chamber 26 toward the support wall 18 as shown in FIG. 2, the chamber 27 is constructed so as to be slidable. Additionally, the outer chamber 26 itself is adapted so as to slide toward the support wall 18.

That is, in the state of FIG. 1, the liquid processing about the wafers W carried by the rotor 24 is performed in a processing chamber 52 defined by the inner chamber 27 and the vertical walls 26a, 26b. On the other hand, in the state of FIG. 2, the rotor 24 is accommodated in a processing chamber 51 defined by the outer chamber 27 and the vertical walls 26a, 26b, effecting the liquid processing for the wafers W.

Note, when sliding both of the outer chamber 26 and the inner chamber 27 closer to the support wall 18, there is defined a free space in the direction of a lateral face of the rotor 24 (i.e. the radial direction of the wafers W). Therefore, the stand-by area for the wafers W may be established below the rotor 24 to allow of exchange of the processed wafers W for the wafers W before the liquid processing.

The vertical wall 26a is attached to the support cylinder 25. A bearing 28 is provided between the support cylinder 25 and the rotating shaft 23a. The vertical wall 26a and the leading end of the support cylinder 25 are sealed up with a labyrinth seal 29 to prevent particles etc. produced in the motor 23 from invading the processing chambers 51, 52. Note, the support cylinder 25 is provided, on its end on the side of the motor 23, with an engagement member 25a for engagement with the outer chamber 26 and the inner chamber 27.

Attached to the upper part of the vertical wall 26b is an ejection nozzle 54 which includes a number of ejecting orifices 53 and whose longitudinal direction is substantially identical to a horizontal direction. The nozzle 54 is adapted so as to be able to eject pure water, IPA, processing liquids (chemicals of various kinds), which have been supplied from a processing-liquid supplier (not shown in FIG. 2), $N_2$-gas, etc. into the processing chamber 51 which is defined by the outer chamber 26 and the vertical walls 26a, 26b as a result of shifting the inner chamber 27 toward the support wall 18.

On the other hand, an ejection nozzle 56 having a number of ejecting orifices 55 is attached to the upper part of the inner chamber 27 in a manner that the longitudinal direction of the nozzle 56 coincides with the horizontal direction. The ejection nozzle 56 is adapted so as to be able to eject the processing liquids, such as the chemicals of various kinds, pure water and IPA, which have been supplied from a processing-liquid supplier (not shown in FIG. 1). It is advantageous that the nozzles 54 and 56 are made of fluorinated resin, such as PTFE and PFA, stainless steel, etc.

Note, the inner chamber 27 is provided, on an inside upper wall thereof, with ejection nozzles 75a, 75b which eject the processing liquid to clean the opposing faces (facing the wafers W) of the circular plates 70a, 70b. Additionally, on the vertical walls 26a, 26b, liquid ejection nozzles 74a, 74b are arranged in order to clean the respective faces of the plates 70b, 70a opposing the vertical walls 26a, 26b, respectively. Mainly, these ejection nozzles 74a, 74b, 75a, 75b are used for purposes of rinsing various chemicals from the circular plates 70a, 70b with pure water.

On the lower part of the vertical wall 26b, a first drain port 61 is arranged to drain the used chemicals etc. from the processing 51 chamber defined by the outer chamber 26. Above the first drain port 61, a second drain port 62 is arranged to drain the used chemicals, pure water and IPA from the processing chamber 52 defined by the inner chamber 27. The first drain port 61 and the second drain port 62 are connected to a first drain pipe 63 and a second drain pipe 64, respectively.

On the upper part of the vertical wall 26b, a first exhaust port 65 is arranged to discharge an atmosphere in the processing chamber 51 defined by the outer chamber 26. Under the first exhaust port 65, a second exhaust port 66 is arranged to discharge an atmosphere in the processing chamber 52 of the inner chamber 27. The first exhaust port 65 and the second exhaust port 66 are connected to a first exhaust pipe 67 and a second exhaust pipe 68, respectively.

Basically, the above-mentioned liquid processing operation of the wafers W using the outer chamber 26 and the ejection nozzle 54 can be performed in the same mariner as that of the liquid processing operation of the wafers W using the inner chamber 27 and the ejection nozzle 56. Therefore, we next describe both method and structure for supplying the ejection nozzle 56 in the inner chamber 27 with the processing liquid, representatively.

Figure 3:
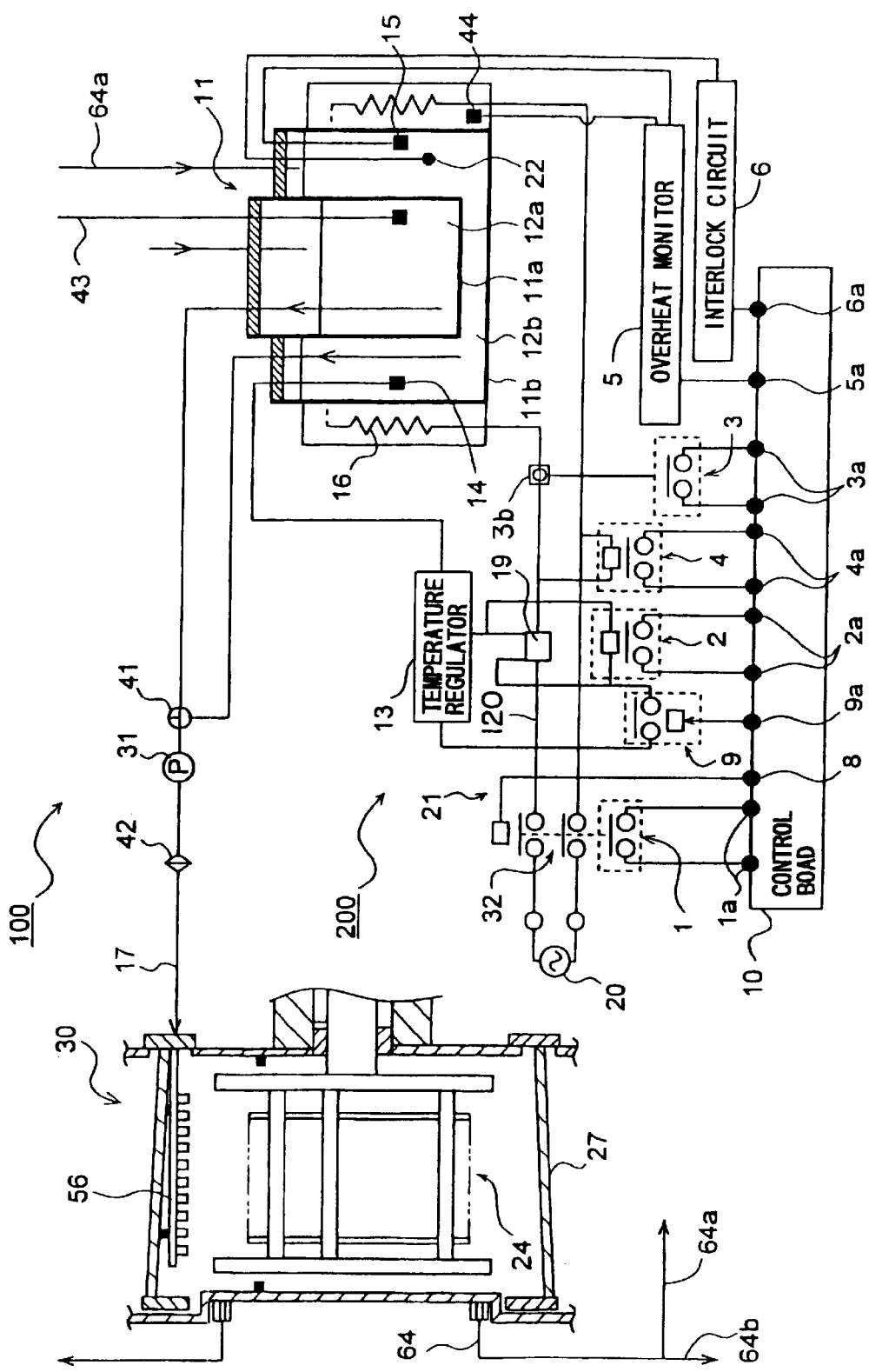
FIG. 3 is an explanatory view showing an embodiment of a liquid supplying part of the liquid processing apparatus using the heating device of the present invention.

FIG. 3 is an explanatory diagram showing the structure of a processing-liquid supplying unit 100 for supplying the processing liquid to the ejection nozzle 56 of FIG. 1 and also the structure of a heating unit 200 arranged side by side with the unit 100, mainly. A reservoir tank 11 has a double structure composed of an inner tank 11a and an outer tank 11b having its periphery with a heater 16.

The outer tank 11b is adapted so as to store a processing liquid 12b which has been once used and subsequently withdrawn through a drain pipe 64a. On the other hand, the inner tank 11a is adapted so as to store a new processing liquid 12a. Thus, the processing liquid 12b in the outer tank 11b is heated up to a designated temperature by the heater 16 on one hand. While, the processing liquid 12a in the inner tank 11a is heated and maintained at another designated temperature by the processing liquid 12b in the outer tank 11b.

The provision of a selector 41, such as three-directional valve, allows either one of the processing liquid 12b in the outer tank 11b and the processing liquid 12a in the inner tank 11a to be supplied to the ejection nozzle 56 due to the switching operation of the selector 41. Consequently, for example, it is possible to establish the cleaning process of the wafers W (in sets of twenty-six pieces) accommodated in the rotor 24, as consisting of two processes: preliminary and main cleaning steps. In this case, the processing liquid 12b in the outer tank 11b is used for the preliminary cleaning process. The processing liquid, which has been used for the preliminary cleaning process, is discharged for waste through the drain pipe 64b. In the sequent main cleaning process, the new processing liquid 12a in the inner tank 11a is used and the same liquid, which has been used for the main cleaning process, is collected into the outer tank 11b through the drain pipe 64a. The processing liquid 12b newly stored in the outer tank 11b in the above way is used in the next-coming preliminary cleaning process. In this way, according to the embodiment, the effective use of the processing liquid can be accomplished by the above-mentioned processing cycle.

Note, the processing liquid 12a/12b stored in the inner tank 11a and the outer tank 11b is fed to the ejection nozzle 56 through a pipe 17 communicating with the nozzle 56 by a pump 31 etc. The pipe 17 may be equipped with a cleaner unit or the like, for example, a filter 42. Although the only one chemical supplying unit 100 is shown in FIG. 3, of course, the shown system may be altered to an arrangement where plural kinds of chemicals can be selectively supplied to the ejection nozzle 56 since a plurality of chemical supplying units communicate with the nozzle 56 through a selector valve or the like.

A temperature sensor 14 is connected with a temperature regulator 13 to detect the temperature of the processing liquid 12b in the outer tank 11b. Comparing a set value (temperature) established in the regulator 13 with the temperature detected by the temperature sensor 14, the regulator 13 transmits "ON/OFF" signals for switching on/off the power supply for the heater 16 to a solid state relay. That is, the temperature sensor 14 and the temperature regulator 13 operate as output control means for controlling the output from a power source 20 to the heater 16. This combination of the temperature sensor 14 and the temperature regulator 13 is only one instance among many output control means.

For example, when the temperature of the processing liquid 12b is smaller than the set value, the temperature regulator 13 outputs the "ON" signal to the solid state relay 19 to supply electricity to the heater 16. Additionally, the solid state relay 19 operates so as to repeat its ON/OFF state in a manner that the temperature of the processing liquid 12b in the outer tank 11b does not exceed the set value.

The temperature of the processing liquid 12a in the inner tank 11a is detected by a temperature sensor 43 in FIG. 3; nevertheless the measurement by the sensor 43 does not take part in the control of the heater 16 directly. The reason is that the shown apparatus is capable of producing little difference in temperature between the processing liquid 12b in the outer tank 11b and the processing liquid 12a in the inner tank 11a.

The heater 16 is connected to the power source 20 thereby to form a power supply circuit 120. In the power supply circuit 120 between the heater 16 and the power source 20, there are an ON/Off contact 32 of a power switch 21 for the heater 16 and an ON/Off contact of the solid state relay 19. Therefore, if neither the power switch 21 nor the solid state relay 19 has an abnormality in operation, the electricity is supplied to the heater 16 only when these ON/OFF contacts occupy their positions of the "ON" state together.

The temperature of the processing liquid 12b in the outer tank 11b is detected by a temperature sensor 15, also. The temperature sensor 15 is connected to an overheat monitor 5. Further, a temperature sensor 44 fro detecting the temperature of the heater 16 is also connected to the overheat monitor 5. The overheat monitor 5 is connected, at a terminal 5a, with a control board 10. When the temperature of the processing liquid 12b in the outer tank 11b or the temperature of the heater 16 exceeds a predetermined upper limit of temperature, the overheat monitor 5 carries out an operation, such as cutting of power supply for the heater 16, in accordance with the sequence control established in the control board 10. The above-mentioned overheat monitor 5 effectively functions, for example, when the temperature of the processing liquid 12a/12b is elevated due to the failure in the temperature sensor 44 and the temperature regulator 13.

A level sensor 22 is arranged in the outer tank 11b. The level sensor 22 is also connected with an interlock circuit 6 which is connected, at a terminal 6a, with the control board 10. When the level sensor 22 detects a situation that the processing liquid 12b is not stored in the outer tank 11b or detects another situation that the quantity of the liquid 12b is reduced less than a predetermined amount, the interlock circuit 6 operates so as to stop the power supply for the heater 16 or maintain the power switch 21 in the OFF position. Owing to the "interlocking" function like this, it is possible to prevent an unnecessary overheating of the heater 16, whereby the apparatus can be protected from overheating.

In view of controlling the operation of the heater 16 appropriately, preferably, the operations of the overheat monitor 5 and the interlock circuit 6 can be ascertained by means of the control board 10. It is noted that the apparatus of FIG. 3 does not have a mechanism for stopping the drive of the heater 16 if the processing liquid 12a in the inner tank 11a is insufficient. Because there is no possibility that the heater 16 might heat an empty chamber even if the processing liquid 12a in the inner tank 11a is insufficient. Namely, in such a case, the outer tank 11b is not damaged. However, it is preferable to also provide a level sensor in the inner tank 11a thereby to establish a situation that the designated processing liquid is being supplied into the tank.

Besides the overheat monitor 5 and the interlock circuit 6 mentioned above, the heating unit 200 includes a contact monitor 1 for monitoring the ON/OFF contact 32 for the heater 16, as one of failure detection means (units). The contact monitor 1 is connected with the control board 10 through a terminal 1a. For example, the ON/OFF contact 32 is formed by magnet conductors. This means that the power switch 21 is formed by an ON/OFF switch 8 on a panel of the control board 10, etc. and the ON/OFF contact 32, such as magnet conductor, which switches on/off the conductivity of the circuit on receipt of the ON/OFF signals from the ON/OFF switch 8.

For example, if the magnet conductor etc. has an operational failure in spite of ON-state in the ON/OFF switch 8 of the power switch 21, then the ON/OFF contact 32 does not become its ON-state (conductive condition), so that the heater 16 is not supplied with electricity. On the other hand, there is a possibility that the ON/OFF contact 32 always occupies the ON-state in spite of OFF-state in the ON/OFF switch of the power switch 21. Therefore, the contact monitor 1 serves to detect such a failure of the ON/OFF contact 32.

That is, since the contact monitor 1 detects the condition of the ON/OFF contact 32 of the power switch 21 through a different circuit from the ON/OFF switch 8, the monitor 1 is capable of detecting the abnormality of the ON/OFF contact 32 of the power switch 21 independently. Furthermore, as mentioned later, if combining the detection results of the contact monitor 1 with those of the other monitors, then it is possible to grasp the cause of failure relating to the other heater 16.

Presented as another monitor constituting the failure detecting means is a primary-side signal detecting monitor 2 which detects the ON/OFF signals from the temperature regulator 13 to the solid state relay 19, namely, the ON/OFF signals on the primary side (input side) of the solid state relay 19. The primary-side signal detecting monitor 2 includes a solid state relay and is connected with the control board 10 through a terminal 2a. The primary-side signal detecting monitor 2 is capable of judgment of the failure of the temperature regulator 13 by itself. For example, when the primary-side signal detecting monitor 2 detects the OFF state in spite of the display of the temperature regulator 13 itself representing the output of the ON signal from the temperature regulator 13 to the solid state relay 19, it is detected that the temperature regulator 13 has a failure.

Additionally, as mentioned later, when combining the detection result on the primary-side signal detecting monitor 2 with the detection results of the other monitors, then it is possible to judge the failure in the solid state relay 19, for example, short-circuit, breaking-down, etc. Note, between the temperature regulator 12 and the solid state relay 19, there is an ON/OFF switch 9 which operates in association with the operation of an ON/OFF switch 9a on the control board 10 and which may be used as a switch in case of activating or inactivating the solid state relay 19 frequently, for example.

In the power supply circuit 120 on the secondary (output) side of the solid state relay 19, a secondary-side output voltage detecting monitor 4 is arranged to detect the state of the ON/OFF contact in the solid state relay 19, as the failure detecting means. The secondary-side output voltage detecting monitor 4 includes a solid state relay and is connected with the control board 10 through a terminal 4 a. The secondary-side output voltage detecting monitor 4 mainly detects whether the solid state relay 19 itself operates normally on receipt of the ON/OFF signals from the temperature regulator 13 etc. For example, when the secondary-side output voltage detecting monitor 4 detects the OFF state while the primary-side signal monitor 2 is detecting the ON signal, it is judged that the ON/OFF contact in the solid state relay 19 has a failure of breaking-down.

A current monitor 3 in the heating unit 200 also constitutes the failure detecting means which detects an electric current flowing through the heater 16 via the power supply circuit 120, in the form of the ON/OFF signals based on a constant threshold value while using a current transformer 3b or the like. The current monitor 3 is connected with the control board 10 through a terminal 3a. In detail, the current monitor 3 detects abnormalities, for example, the flowing or an excessive current in the circuit due to the short-circuit of circuit parts, the flowing of little current due to the breaking-down of the heater 16 etc. and raises a warning correspondingly.

As mentioned above, the contact monitor 1, the primary-side signal detecting monitor 2, the current monitor 3, the secondary-side output voltage detecting monitor 4, the overheat monitor 5 and the interlock circuit 6 are respectively connected with the control board 10 through the terminals 1a to 6a. The signals from these monitors are processed independently or in combination by circuits in the control board 10 and thereupon, the abnormality in controlling the heater generated in the heating unit 200 is detected to judge the cause of failure.

Various examples of the above-mentioned failure judgments in the heating unit 200 will be described below. The detecting forms by these monitors and also the failure causes on the ground of the detecting forms are shown in Table 1 in brief.

TABLE 1

|  | power switch of heater | contact monitor | primary-side signal detecting monitor | current monitor | secondary-side output voltage detecting monitor | cause of failure |
|---|---|---|---|---|---|---|
| Example 1 | OFF | 1 | — | — | — | abnormal heater control (failure of ON/OFF contact in power switch) |
| Example 2 | OFF | — | — | — | 1 | abnormal heater control (failure of ON/OFF contact in power switch) |
| Example 3 | OFF | — | — | 0 | — | abnormal heater control (failure of ON/OFF contact in power switch) |

TABLE 1-continued

| | power switch of heater | contact monitor | primary-side signal detecting monitor | current monitor | secondary-side output voltage detecting monitor | cause of failure |
|---|---|---|---|---|---|---|
| Example 4 | ON | 0 | — | — | — | failure of heater control by interlocking or failure of ON/OFF contact in power switch |
| Example 5 | ON | 1 | 1 | 1 | 0 | breaking-down of solid relay |
| Example 6 | ON | 1 | 0 | — | 1 | short-circuit of solid state relay |
| Example 7 | ON | 1 | 1 | 1 | 1 | breaking-down of heater |

Note
Regarding table contents of the contact monitor, the primary-side signal detecting monitor and the secondary-side output voltage detecting monitor, (−) represents the unused condition, (0) a condition non-detecting signal (or voltage) and (1) denotes a condition detecting signal (or voltage).

Regarding contents of the current monitor, (−) designates the unused condition, (0) a condition that normal current is flowing and (1) denotes a condition that current has an abnormality.

In Table 1, Example 1 shows a condition that the contact monitor 1 detects the conduction in the ON/OFF contact 32 of the power switch 21 in spite of the OFF state of the ON/OFF switch 8 of the power switch 21 wherein all of the primary-side signal detecting monitor 2, the current monitor 3 and the secondary-side output voltage detecting monitor 4 are not used.

Example 2 shows a condition that the secondary-side output voltage detecting monitor 4 of the solid state relay 19 detects a voltage in spite of the OFF state of the ON/OFF switch 8 of the power switch 21 wherein all of the contact monitor 1, the primary-side signal detecting monitor 2 and the current monitor 3 are not used. The Example 2 exhibits that the abnormality in controlling the heater 16 is caused since the power switch 21 itself has a malfunction to close the ON/OFF contact 32 while the ON/OFF contact in the solid state relay 19 is closed, Example 3 shows a condition that the current monitor 3 detects the current in spite of the OFF state of the ON/OFF switch 8 of the power switch 21 wherein all of the contact monitor 1, the primary-side signal detecting monitor 2 and the current monitor 3 are not used. Therefore, the Example 3 also represents that the abnormality in controlling the heater 16 is caused since the power switch 21 and the solid state relay 18 have malfunctions to close the circuit.

Example 4 shows a condition that the ON/OFF contact 32 of the power switch 21 opens into no conduction in spite of the ON state of the ON/OFF switch 8 of the power switch 21 wherein all of the primary-side signal detecting monitor 2, the current monitor 3 and the secondary-side output voltage detecting monitor 4 are not used. As one cause of this case, it is expected that the closing of circuit results from the inoperability of the ON/OFF contact 32, for example, an inoperability of magnet conductors forming the contact 32. As another cause, there is a case that the outer tank 11b is not filled up with the processing liquid 12b of the designated quantity and consequently, the interlock circuit 6 is activated so as to cut off the power line, on receipt of a "low-level" signal detected by the level sensor 22.

Example 5 shows a condition that, in the ON state of the ON/OFF switch 8 of the power switch 21, the contact monitor 1 detects the normal operation of the conductive ON/OFF contact 32 while the primary-side signal detecting monitor 2 is detecting the voltage. In other words, the Example 5 shows a condition that the secondary-side output voltage detecting monitor 4 does not detect the voltage on the secondary (output) side of the solid state relay 19 despite that the ON signal to supply the heater 16 with electric power is transmitted from the temperature regulator 13 to the solid state relay 19.

In this case, it is judged that the solid state relay 19 is subjected to the breaking down of a wire, by reason of supplying the heater 16 with no power. Under such a situation, it does not matter whether the detection result on the current monitor 2 is employed for the judgment or not. That is, even if the current monitor 2 is not used, the breaking-down of the solid state relay 19 can be detected by the contact monitor 1, the primary-side signal detecting monitor 2 and the secondary-side output voltage detecting monitor 4. While, it the solid state relay 19 is subjected to the breaking-down, then the current monitor 3 raises a warning representing the abnormality in controlling the heater 16 resulting from no current flowing through the circuit.

Example 6 shows a condition that, in the ON state of the ON/OFF switch 8 of the power switch 21, the contact monitor 1 detects the normal operation of the conductive ON/OFF contact 32 while the primary-side signal detecting monitor 2 does not detect the voltage. In other words, the Example 6 represents a condition that the secondary-side output voltage detecting monitor 4 detects the voltage on the secondary (output) side of the solid state relay 19 despite that the OFF signal to supply the heater 16 with no power is transmitted from the temperature regulator 13 to the solid state relay 19.

In this case, it is judged that the solid state relay 19 is out of order so that the ON/OFF contact has a short-circuits. Under this situation that the current of a stated value flows through the circuit, if the detected current is within the range of the established threshold value, the current monitor 3 judges that the circuit is operating normally. On the contrary, if the detected current is out of the range of the established threshold value, then the current monitor 3 raises the abnormality alarm. For this reason, in case of the Example 6, the rejection of result detected by the current monitor 3 allows of more accurate judgments.

As presented by the Examples 5 and 6, owing to the provision of the primary-side signal detecting monitor 2 and the secondary-side output voltage detecting monitor 4, it is possible to diagnose the malfunction of the solid state relay 19 with the simplified circuit. Thus, according to the embodiment, there is no need to provide an expensive solid state relay having a diagnostic function. Note, this solid state relay having the diagnostic function only detects the failure of the solid state relay itself. On the contrary, according to the invention, since the primary-side signal detecting monitor 2 and the secondary-side output voltage detecting monitor 4 are combined with the detecting results of the other monitors, it is also possible to judge other failures besides the failure in the solid state relay 19.

Example 7 shows a condition that, in the ON state of the ON/OFF switch 8 of the power switch 21, the contact monitor 1 detects the normal operation of the conductive ON/OFF contact 32. In this condition, the primary-side signal detecting monitor 2 detects a state that the ON signal is transmitted from the temperature regulator 13 to the solid state relay 19 so as to supply the heater 16 with power. Further, the Example 7 represents a condition that the current monitor 3 raises the warning as a result of no detection of the current of the stated value despite that the secondary-side output voltage detecting monitor 4 detects the voltage on the output side of the solid state relay 19.

In this case, it is judged that no current flows through the circuit due to the breaking-down of the heater 16, in view of no abnormality in the power switch 21 and the solid state relay 19.

As mentioned above, the heating unit 200 of this embodiment is capable of using some of various monitors selectively or using all of them, allowing the abnormality occurring in the circuits forming the heating unit 200 to be grasped with the specified cause. Consequently, it is possible to take an appropriate and wasteless measure corresponding to the cause of failure. Note, the heating unit may be formed with a sequential program which is so designed as to cut off the power switch 21 or a breaker as the foundation of the power source 20 when the abnormality in controlling the heater 16 is detected by the various monitors. In such a case, it is possible to protect the processing liquid supplying unit 100.

Although one embodiment of the present invention has been described, it goes without saying that the present invention is not limited to the above-mentioned embodiment only and various changes and modifications may be made to the present invention. For example, the heating device in accordance with the present invention may be employed in a heating part of a heater assembled in a hot-plate unit (heating process unit) used in the resist-application process for semiconductor wafers or in the developing process although the heating device of the invention is applied to the liquid processing apparatus in the above-mentioned embodiment. That is, an object to be heated by the heating device of the invention is not limited to only liquids, such as processing liquid. The present invention is also applicable to the heating device for solid or gas.

Additionally, although the above descriptions are included in the application for processing semiconductor wafers, with no limitation to this application, the invention is applicable to a heating unit of the apparatus for applying a liquid processing on the other substrates, such as substrates for liquid crystal display (LCD) unit. Although the chamber for the liquid processing is constructed doubly in the embodiment, either of a single element and three or more elements will constitute the chamber in the modification. Further, the tank storing the processing liquid does not have to be formed with double-structure of the embodiment.

As mentioned above, according to the present invention, the heating device and the liquid processing apparatus employing the heating device commonly include the monitors for detecting various malfunctions using the simple constitution of circuits. Therefore, it is possible to classify the abnormality in the heater control into every cause, for example, breaking-out of the heater, breaking-out or short circuit of the solid state relay, abnormality about the power source for heater, thereby allowing of appropriate and prompt recovery/measures based on the so-detected cause of abnormality. In this way, there can be obtained superior effects of: the improvement in controllability of the heating unit, the improvement in its maintenance and the reduction of maintenance cost derived from the reduction in number of parts for exchange. Additionally, because of no use of the expensive solid state relay having the diagnostic function, the heating device can be manufactures with a low price.

What is claimed is:

1. A heating device comprising:
    a heater for heating an object to be heated;
    a power supply circuit for supplying electric power from a power source to the heater;
    a power switch for switching on and off a power output from the power source;
    an output control circuit for controlling the power output from the power source to the heater;
    a relay for switching on and off the operation of the power supply circuit in accordance with signals outputted from the output control circuit; and
    a failure detecting circuit for detecting an operational failure of the heating device;
    wherein the failure detecting circuit includes:
        a first monitor for monitoring the operation of an ON/OFF contact in the power switch;
        a second monitor for detecting ON/OFF signals transmitted from the power control circuit to the relay; and
        a third monitor for detecting an output voltage on a secondary side of the relay.

2. A heating device as claimed in claim 1, wherein the relay, the second monitor and the third monitor are formed by a solid, state relay.

3. A heating device as claimed in claim 1, further comprising a control board which displays an output of the first monitor, an output of the second monitor and an output of the third monitor respectively.

4. A heating device as claimed in claim 1, wherein the failure detecting circuit further includes a fourth monitor which includes a current transformer for detecting a current flowing through the heater and further generates the detected current in form of ON/OFF signals standardizing a constant threshold current value.

5. A heating device as claimed in claim 1, wherein the output control circuit includes:
   a temperature sensor for detecting a temperature of the object to be heated; and
   a temperature regulator in which a designated temperature is preset for the object and which generates ON/OFF signals to the relay upon comparing the detected temperature of the object with the designated temperature.

6. A liquid processing apparatus comprising:
   a liquid processing unit which supplies an object to be processed with a processing liquid thereby to carry out a liquid processing;
   a processing-liquid supplying unit to supply the heated processing liquid to the liquid processing unit; and
   a heating unit for heating the processing liquid to a predetermined temperature;
   wherein the heating unit includes:
      a heater for heating the processing liquid;
      a power supply circuit for supplying the heater with an electric power from a power source;
      a power switch for switching on and off a power output from the power source;
      an output control circuit for controlling the power output supplied from the power source to the heater;
      a relay for switching on and off the operation of the power supply circuit in accordance with signals generated from the output control circuit; and
      a failure detecting circuit for detecting an operational failure of the heating unit; and
   the failure detecting circuit includes:
      a first monitor for monitoring the operation of an ON/OFF contact in the power switch;
      a second monitor for detecting ON/OFF signals transmitted from the power control circuit to the relay; and
      a third monitor for detecting an output voltage on a secondary side of the relay.

7. A liquid processing apparatus as claimed in claim 6, wherein the failure detecting circuit further includes a fourth monitor which includes a current transformer for detecting a current flowing through the heater and further generates the detected current in form of ON/OFF signals standardizing a constant threshold current value.

8. A liquid processing apparatus as claimed in claim 6, wherein the output control circuit includes:
   a temperature sensor for detecting a temperature of the processing liquid; and
   a temperature regulator in which a designated temperature is preset for the processing liquid and which generates ON/OFF signals to the relay upon comparing the detected temperature of the processing liquid with the designated temperature.

9. A liquid processing apparatus as claimed in claim 6, wherein the failure detecting circuit includes an overheat monitor which monitors both a temperature of the processing liquid and a temperature of the heater thereby to detect whether the processing liquid is overheated or not.

10. A liquid processing apparatus as claimed in claim 6, further comprising an ON/OFF switch interposed in a wiring between the output control circuit and a primary side of the relay.

11. A liquid processing apparatus as claimed in claim 6, further comprising an interlocking circuit which turns the power switch off when the quantity of the processing liquid to be heated is less than a predetermined quantity.

12. A liquid processing apparatus as claimed in claim 6, wherein the processing-liquid supplying unit includes:
   a tank having the processing liquid stored therein, the tank being equipped with the heater;
   a supply pipe through which the processing liquid is supplied from the tank to the liquid processing unit; and
   a collecting pipe for collecting the processing liquid which has been used in the liquid processing unit, into the tank.

13. A liquid processing apparatus as claimed in claim 12, wherein
   the tank has an inner tank and an outer tank in double structure;
   the collecting pipe in connected to the outer tank; and wherein
   the heater is arranged in the periphery of the outer tank.

14. A liquid processing apparatus as claimed in claim 13, wherein the output control circuit includes:
   a temperature sensor arranged in the outer tank to detect a temperature of the processing liquid; and
   a temperature regulator in which a designated temperature is preset for the processing liquid and which generates ON/OFF signals to the relay upon comparing the detected temperature of the processing liquid with the designated temperature, and
   the output control circuit controls so that the temperature of the processing liquid in the outer tank is maintained to the designated temperature.

15. A liquid processing apparatus as claimed in claim 6, wherein the processing-liquid supply unit has a tank having the processing liquid stored therein, the tank being equipped with the heater; and
   the liquid processing apparatus further comprises a level sensor disposed in the tank to detect a level of the processing liquid stored in the tank and an interlocking circuit which turns the power switch off when the quantity of the processing liquid to be heated is less than a predetermined quantity.

16. A failure detecting method of detecting a circuit failure in a heating device, the heating device having a power supply circuit-connecting a power source to a heater, an ON/OFF contact arranged in the power supply circuit and also operated by a power switch to supply the heater with electric power and a relay arranged in the power supply circuit to control the power supply for the heater intermittently, the method comprising the steps of:
   in case of turning the power switch off, detecting at least one of the operation of the ON/OFF contact, the ON/OFF state of an output voltage on a secondary side of the relay and the ON/OFF state of a current in the power supply circuit; and
   judging whether the ON/OFF contact has a failure, on a basis of a result of the detecting step.

17. A failure detecting method of detecting a circuit failure in a heating device, the heating device having a relay arranged in a power supply circuit connecting a power source to a heater, for controlling the power supply for the heater intermittently, the method comprising the steps of:
   detecting the ON/OFF state of an input signal on a primary side of the relay and the ON/OFF state of an output voltage on a secondary side of the relay; and
   judging whether the relay is subjected to snapping or short-circuit, on a basis of a result of the detecting step.

18. A failure detecting method as claimed in claim 17, further comprising the step of detecting the ON/OFF state of a current flowing through the power supplying circuit, whereby the snapping of the heater can be detected on a basis of a result of the detecting step.

* * * * *